(12) United States Patent
Matsushita

(10) Patent No.: US 9,593,259 B2
(45) Date of Patent: Mar. 14, 2017

(54) POLISHING COMPOSITION

(71) Applicant: NITTA HAAS INCORPORATED, Osaka (JP)

(72) Inventor: Takayuki Matsushita, Kyoto (JP)

(73) Assignee: NITTA HAAS INCORPORATED, Osaka (JP)

( * ) Notice: Subject to any disclaimer, the term of this patent is extended or adjusted under 35 U.S.C. 154(b) by 0 days.

(21) Appl. No.: 14/440,688

(22) PCT Filed: Nov. 19, 2013

(86) PCT No.: PCT/JP2013/081164
§ 371 (c)(1),
(2) Date: May 5, 2015

(87) PCT Pub. No.: WO2014/084091
PCT Pub. Date: Jun. 5, 2014

(65) Prior Publication Data
US 2015/0299517 A1 Oct. 22, 2015

(30) Foreign Application Priority Data

Nov. 30, 2012 (JP) ................................. 2012-262549

(51) Int. Cl.
*C09G 1/02* (2006.01)
*C23F 1/30* (2006.01)
(Continued)

(52) U.S. Cl.
CPC .............. *C09G 1/02* (2013.01); *C09K 3/1409* (2013.01); *C23F 1/30* (2013.01); *H01L 21/02024* (2013.01)

(58) Field of Classification Search
CPC . C09G 1/02; B24B 37/044; C23F 1/30; C23F 3/04; C23F 3/06
See application file for complete search history.

(56) References Cited

U.S. PATENT DOCUMENTS

| 7,560,384 B2 * | 7/2009 | Shida ................. H01L 21/3212 216/89 |
| 2006/0135045 A1 * | 6/2006 | Bian ....................... C09G 1/02 451/36 |

(Continued)

FOREIGN PATENT DOCUMENTS

| CN | 100435290 | 11/2008 |
| DE | 102005058692 | 7/2006 |

(Continued)

*Primary Examiner* — Duy Deo
(74) *Attorney, Agent, or Firm* — Clark & Brody

(57) ABSTRACT

A polishing composition of the present invention contains: a polyvinyl alcohol resin having a 1,2-diol structure in its side chain, the polyvinyl alcohol resin being a copolymer of a monomer represented by Formula (1) below and a vinyl ester monomer; an organic acid; and abrasive grains whose surfaces are chemically modified so as to have a minus zeta potential on the surfaces in a solution with a pH of 2.0 or more and to have no isoelectric point:

$$\begin{array}{c} R^1 \\ \diagdown \\ R^2 \end{array} C = C \begin{array}{c} R^3 \\ \diagup \\ \diagdown \end{array} X - \underset{|}{\overset{R^4}{C}} - \underset{|}{\overset{R^5}{C}} - R^6 \\ \phantom{XXXXXXX} OR^7 \; OR^8 \quad (1)$$

(where $R^1$ to $R^6$ each independently denote a hydrogen atom or an organic group, X denotes a single bond or a linking group, and $R^7$ and $R^8$ each independently denote a hydrogen atom or $R^9$—CO— (where $R^9$ denotes an alkyl group)).

6 Claims, 1 Drawing Sheet

(51) Int. Cl.
  *C09K 3/14*   (2006.01)
  *H01L 21/02*  (2006.01)

(56) References Cited

U.S. PATENT DOCUMENTS

2007/0179238 A1*  8/2007  Armini ................ B24B 37/044
                                                    524/493
2009/0023880 A1   1/2009  Shibutani
2010/0197853 A1   8/2010  Sugaya

FOREIGN PATENT DOCUMENTS

| JP | 08-45934    | 2/1996  |
| JP | 11-116942   | 4/1999  |
| JP | 2009-001811 | 1/2009  |
| JP | 2009-088010 | 4/2009  |
| JP | 2010-535144 | 11/2010 |
| JP | 2011-181884 | 9/2011  |
| JP | 2012-079717 | 4/2012  |
| JP | 2012-216723 | 11/2012 |
| WO | 2006-018870 | 2/2006  |

* cited by examiner

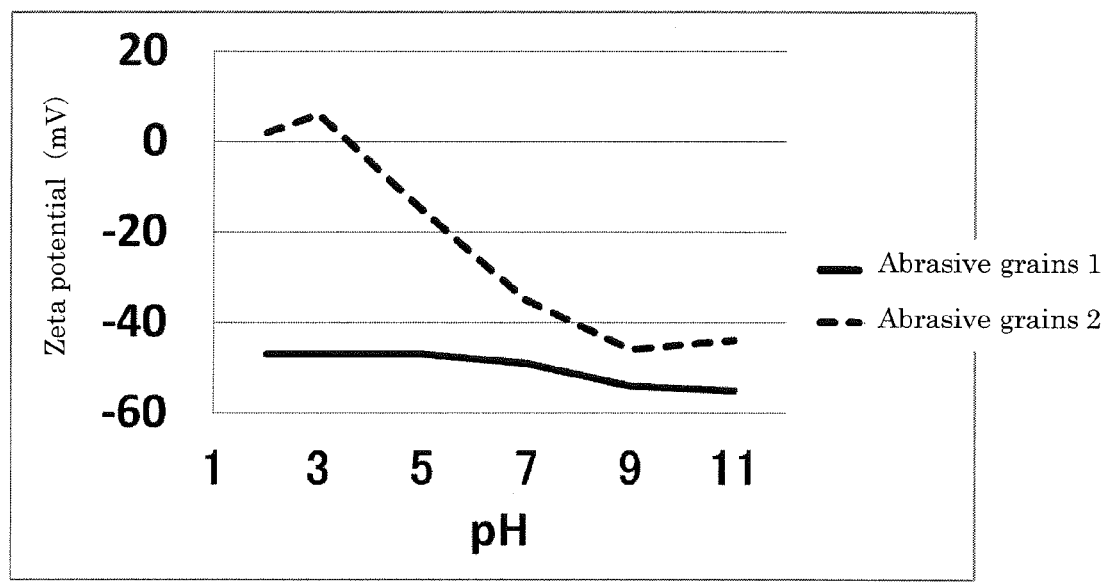

POLISHING COMPOSITION

CROSS-REFERENCE TO RELATED APPLICATION

This application claims priority to Japanese Patent Application No. 2012-262549, the disclosure of which is incorporated herein by reference in its entirety.

FIELD

The present invention relates to a polishing composition for polishing a product to be polished such as a semiconductor wafer.

BACKGROUND

In the production process of a semiconductor device, a product to be polished such as a wafer is polished using a polishing composition.

For example, a wafer is produced by polishing (which hereinafter may be referred to as polishing) a thin circular plate-shaped silicon or the like as a product to be polished that is obtained by slicing a single crystal ingot of silicon or another compound semiconductor, lapping it, and etching it.

Further, also when a fine electrical circuit is formed on a surface of the wafer, the surface of the wafer on which the circuit is formed is polished. In such a polishing step, polishing is performed generally using a polishing composition containing abrasive grains.

The surface of the product to be polished after polishing has to be clean, particularly in a step of finally polishing the silicon, even a slight amount of contamination on the surface of the wafer after the polishing is required to be eliminated.

In order to facilitate the removal of foreign matter that is one of the causes of such a contamination after the polishing such as residual abrasive grains and polishing waste on the surface of the wafer, a hydrophilic water soluble polymer that is hydrophilic with respect to the surface of the wafer is mixed in the polishing composition.

For example, Patent Literature 1 discloses a polishing composition using hydroxyethyl cellulose as the hydrophilic water soluble polymer.

However, hydroxyethyl cellulose has a large molecular weight, and tends to cause aggregation of abrasive grains due to its molecular structure when it is mixed in the polishing composition, which is a problem. Generally, the polishing composition is filtered before use. Since the polishing composition in which hydroxyethyl cellulose is mixed is easily clogged, a coarse filter needs to be used for its filtering. Thus; it is difficult to remove fine aggregate particles. When polishing is performed while such aggregate particles are present, the surface of the wafer is damaged, thereby causing surface defects (LPD: Light point defects). Further, since hydroxyethyl cellulose is a polymer derived from natural products, it is difficult to obtain a stable quality, which is another problem.

In order to suppress the aggregation of abrasive grains, it has been conceived that the surfaces of abrasive grains are subjected to a chemical surface treatment, thereby making it difficult for the abrasive grains to aggregate with each other in the polishing composition.

For example, Patent Literatures 2 and 3 disclose that the dispersibility of the abrasive grains in the polishing composition is enhanced by performing a surface treatment using silane or the like.

Patent Literature 4 discloses colloidal silica subjected to a surface treatment with aluminate ions, boric acid, or the like, or colloidal silica in which the surface potential is controlled.

However, even in the case of using the abrasive grains subjected to such a surface treatment, it is difficult to suppress their aggregation when they are present in the polishing composition together with hydroxyethyl cellulose.

Further, as a cause of the contamination of the wafer, there is metal contamination in which a slight amount of metal components derived from materials of the polishing composition or the wafer adheres onto the wafer, other than the residual abrasive grains and polishing waste. Such metal contamination after the polishing causes defects called pits on the surface of the wafer. However, it is difficult to reduce the metal contamination in conventional polishing compositions.

CITATION LIST

Patent Literature

Patent Literature 1: JP 1111-116942 A
Patent Literature 2: JP 1108-45934 A
Patent Literature 3: JP 2010-535144 T
Patent Literature 4: JP 2009-088010 A

SUMMARY

Technical Problem

In consideration of such conventional problems, it is therefore an object of the present invention to provide a polishing composition that is capable of reducing contamination on a surface of a product to be polished after polishing while suppressing aggregation of abrasive grains.

Solution to Problem

A polishing composition according to the present invention contains: a polyvinyl alcohol resin having a 1,2-diol structure in its side chain, the polyvinyl alcohol resin being a copolymer of a monomer represented by Formula (1) below and a vinyl ester monomer; an organic acid; and abrasive grains whose surfaces are chemically modified so as to have a minus zeta potential on the surfaces in a solution with a pH of 2.0 or more and to have no isoelectric point.

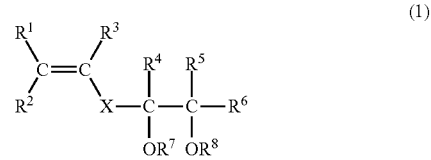

(In the formula, $R^1$ to $R^6$ each independently denote a hydrogen atom or an organic group, X denotes a single bond or a linking group, and $R^7$ and $R^8$ each independently denote a hydrogen atom or $R^9$—CO— (where $R^9$ denotes an alkyl group).)

In the present invention, the organic acid may be at least one chelating agent selected from the group consisting of an aminocarboxylic acid chelating agent and a phosphonic acid chelating agent.

BRIEF DESCRIPTION OF DRAWINGS

FIG. 1 is a graph showing a variation in zeta potential due to pH.

DESCRIPTION OF EMBODIMENTS

Hereinafter, a polishing composition according to the present invention is described.

The polishing composition of this embodiment contains the following components A to C:
A: A polyvinyl alcohol resin that has a 1,2-diol structure in its side chain and that is a copolymer of a monomer represented by Formula (1) below and a vinyl ester monomer
B: An organic acid
C: Abrasive grains whose surfaces are chemically modified so as to have a minus zeta potential on the surfaces in a solution with a pH of 2.0 or more and to have no isoelectric point:

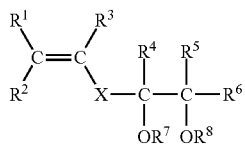
(1)

(where $R^1$ to $R^6$ each independently denote a hydrogen atom or an organic group, X denotes a single bond or a linking group, $R^7$ and $R^8$ each independently denote a hydrogen atom or $R^9$—CO— (where $R^9$ denotes an alkyl group)).

(A) Polyvinyl Alcohol Resin

The polishing composition of this embodiment contains a polyvinyl alcohol resin that has a 1,2-diol structure in its side chain and that is a copolymer of a monomer represented by Formula (1) above and a vinyl ester monomer.

The polyvinyl alcohol resin having a 1,2-diol structure in its side chain is hydrophilic with respect to the product to be polished, and therefore adhesion of residual abrasive grains, polishing waste, or the like onto the surface of the product to be polished is less likely to occur. At the same time, also in the case of existing together with abrasive grains of the component C, aggregation of the abrasive grains is suppressed.

Examples of vinyl ester monomer that is a raw material of the polyvinyl alcohol resin of this embodiment include vinyl formate, vinyl acetate, vinyl propionate, vinyl valerate, vinyl butyrate, vinyl isobutyrate, vinyl pivalate, vinyl caprate, vinyl laurate, vinyl stearate, vinyl benzoate, and vinyl versatate.

In particular, vinyl acetate is preferable because of its low cost and good availability.

$R^1$ to $R^6$ in the monomer that is a raw material of the polyvinyl alcohol resin of this embodiment and is represented by Formula (1) mentioned above each independently denote a hydrogen atom or an organic group.

$R^1$ to $R^6$ are all preferably hydrogen atoms.

In the case where $R^1$ to $R^6$ are organic groups, examples thereof include alkyl groups having 1 to 4 carbon atoms such as a methyl group, an ethyl group, an n-propyl group, an isopropyl group, an n-butyl group, an isobutyl group, and a tert-butyl group. Further, the organic groups may have substituents such as a halogen group, a hydroxyl group, an ester group, a carboxylic acid group, and a sulfonic acid group.

X in the monomer represented by Formula (1) above denotes a single bond or a linking group. The linking group X is preferably a single bond for good thermostability.

In the case where the X is a linking group, examples thereof include hydrocarbons such as alkylene, alkenylene, alkynylene, phenylene, and naphthylene (where these hydrocarbons may be substituted, for example, by halogens such as fluorine, chlorine, and bromine), —O—, —(CH$_2$O)$_m$—, —(OCH$_2$)$_m$—, —(CH$_2$O)$_m$CH$_2$—, —CO—, —COCO—, —CO(CH$_2$)$_m$CO—, —CO(C$_6$H$_4$)CO—, —S—, —CS—, —SO—, —SO$_2$—, —NR—, —CONR—, —NRCO—, —CSNR—, —NRCS—, —NRNR—, —HPO$_4$—, —Si(OR)$_2$—, —OSi(OR)$_2$—, —OSi(OR)$_2$O—, —Ti(OR)$_2$—, —OTi(OR)$_2$—, —OTi(OR)$_2$O—, —Al(OR)—, —OAl(OR)—, and —OAl(OR)O— (where each R independently denotes an arbitrary substituent and is preferably a hydrogen atom or an alkyl group, and m is a natural number).

In particular, the X is preferably an alkylene group having 6 or less carbon atoms, particularly preferably a methylene group, in view of the stability in production or use.

As the monomer to be, used in this embodiment, 3,4-diacetoxy-1-butene in which $R^1$ to $R^6$ are each a hydrogen atom, X is a single bond, $R^7$ to $R^8$ are each $R^9$—CO—, and $R^9$ is an alkyl group is preferably used. In particular, 3,4-diacyloxy-1-butene in which $R^9$ is a methyl group is preferably used.

As the polyvinyl alcohol resin of this embodiment, a product obtained by copolymerization of vinyl acetate as the vinyl ester monomer and 3,4-diacetoxy-1-butene as the monomer represented by Formula (1) above is preferable.

It should be noted that another monomer may be copolymerized with the polyvinyl alcohol resin of this embodiment, other than the monomer represented by Formula (1) above and the vinyl ester monomer.

Examples of the other monomer include α-olefin such as ethylene and propylene; hydroxy group-containing α-olefins such as 3-butene-1-ol and 4-pentene-1-ol, and derivatives thereof such as their acylated products; unsaturated acids such as itaconic acid, maleic acid, and acrylic acid, or salts thereof or mono or dialkyl esters thereof; nitriles such as acrylonitrile and methacrylonitrile; amides such as acrylamide, methacrylamide, and diacetoneacrylamide; olefin sulfonic acids such as ethylene sulfonic acid, allyl sulfonic acid, and methallyl sulfonic acid, or compounds such as salts thereof, vinyl compounds such as alkyl vinyl ethers, dimethylallyl vinyl ketone, N-vinylpyrrolidone, vinyl chloride, vinyl ethylene carbonate, 2,2-dialkyl-4-vinyl-1,3-dioxolan, glycerin mono allyl ether, and 3,4-diacetoxy-1-butene; substituted vinyl acetates such as isopropenyl acetate and 1-methoxy vinyl acetate; vinylidene chloride; 1,4-diacetoxy-2-butene; and vinylene carbonates.

The vinyl ester monomer of this embodiment is copolymerized with the monomer represented by Formula (1) above or the other monomer, for example, under the following conditions.

A polymerization catalyst may be used for polymerization, and examples of the polymerization catalyst include known radical polymerization catalysts such as azobisisobutyronitrile, acetyl peroxide, benzoyl peroxide, and lauryl peroxide; and low-temperature active radical polymerization catalysts such as azobis dimethylvaleronitrile and azobis methoxy dimethylvaleronitrile.

The reaction temperature of the copolymerization reaction differs depending on the solvent or pressure used. However, the copolymerization reaction is performed, for example, at a temperature in the range of about 30° C. to the boiling point, more specifically 35 to 150° C., preferably 40 to 75° C.

Further, the polyvinyl alcohol resin of this embodiment has a 1,2-diol structure in its side chain. In order to achieve such a structure in the side chain, the copolymer may be saponified, for example.

The saponification, for example, can be performed by dissolving the copolymer in a solvent such as alcohol and using an alkali catalyst or an acid catalyst.

Examples of the solvent include methanol, ethanol, propanol, and tert-butanol.

Further, examples of the catalyst to be used for the saponification include an alkali catalyst and an acid catalyst. Examples of the alkali catalyst include hydroxides or alcoholates of alkali metals such as sodium hydroxide, potassium hydroxide, sodium methylate, sodium ethylate, potassium methylate, and lithium methylate. Further, examples of the acid catalyst include sulfuric acid, hydrochloric acid, nitric acid, methasulfonic acid, zeolite, and cation exchange resin.

The reaction temperature of the saponification reaction is not specifically limited. However, it is preferably 10 to 60° C., more preferably 20 to 50° C.

The content of 1,2-diol structural units in the side chain of the polyvinyl alcohol resin of this embodiment is 0.1 to 20 mol %, preferably 0.1 to 15 mol %, particularly preferably 0.1 to 10 mol %.

In the polishing composition of this embodiment, the content of the polyvinyl alcohol resin, for example, is 0.00001 mass % to 0.5 mass %, preferably about 0.0001 mass % to 0.3 mass %. When the content of the polyvinyl alcohol resin is in the aforementioned range, sufficient removal of a layer damaged in the preceding polishing is enabled, while a significant reduction in polishing rate is prevented without a reduction in wettability to the product to be polished. Further, the content of the polyvinyl alcohol resin in the aforementioned range is preferable, because it makes it easy to suppress the aggregation of abrasive grains and further can give good wettability to the product to be polished.

Further, the polyvinyl alcohol resin can be industrially produced, and therefore the quality is stable as compared to water soluble polymer compounds derived from natural products such as hydroxyethyl cellulose, which have been conventionally mixed in the polishing composition for enhancing the wettability.

As the polyvinyl alcohol resin, a commercially available product such as G polymer (product name), manufactured by the Nippon Synthetic Chemical Industry Co., Ltd., may be used.

(B) Organic Acid

The polishing composition of this embodiment contains an organic acid.

The organic acid mainly functions as a polishing speed adjuster and a chelating agent.

In the case where a product to be polished such as a wafer is polished using the polishing composition, metal impurities derived from materials of the polishing composition or the product to be polished may be incorporated in the polishing composition in some cases. In the case where such metal impurities adhere to the wafer or the like, they cause microholes (pits) or the like on the surface of the wafer.

The polishing composition of this embodiment contains the organic acid, and therefore metal ions derived from metal impurities and the organic acid form a chelate complex, even in the case where the metal impurities are incorporated therein. Thus, the adhesion to the product to be polished can be suppressed.

The organic acid, for example, is preferably capable of forming a chelate complex with each of metal ions such as Cr, Fe, Ni, and Cu. In particular, in the case where Cu ions are present in an acidic solution, they form an insoluble body in the form of $Cu(OH)_2$, so as to be precipitated on the surface of the wafer or the like, thereby causing the pits at such Cu contaminated sites in many cases. Accordingly, a chelating agent that forms a chelate complex with Cu ions is particularly preferable.

The organic acid is not specifically limited. However, examples thereof include carboxylic acid and phosphonic acid.

In particular, the organic acid is preferably at least one chelating agent selected from the group consisting of an aminocarboxylic acid chelating agent and a phosphonic acid chelating agent.

Examples of the aminocarboxylic acid chelating agent include nitrilotriacetic acid (NTA), ethylenediaminetetraacetic acid (EDTA), diethylenetriaminepentaacetic acid (DTPA), triethyleneteraaminehexaacetic acid (TTHA), hydroxyethylethylenediamine triacetic acid (HEDTA), 1,3-propanediamine tetraacetic acid (PDTA), 1,3-diamino-2-hydroxypropane tetraacetic acid (DPTA-OH), hydroxyethylimino diacetic acid (HIDA), dihydroxyethylglycine (DREG), glycol ether diamine-N,N,N',N'-tetraacetic acid (GEDTA), dicarboxymethyl glutamic acid (CMGA), (S,S)-ethylenediamine disuccinic acid (EDDS), and amine salts thereof.

Examples of the phosphonic acid chelating agent include hydroxy ethylidene diphosphate (HEDP), nitrilotris (methylene phosphoric acid) (NTMP), phosphonobutane tricarboxylic acid (PBTC), and ethylenediamine tetramethylene phosphonic acid (EDTMP).

In the polishing composition of this embodiment, the content of the organic acid, for example, is 0.0001 mass % to 0.2 mass %, preferably about 0.0002 mass % to 0.1 mass %.

When the content of the organic acid is in the aforementioned range, residual metals on the product to be polished after the polishing can be reduced.

The organic acid of this embodiment has the following advantage by being used in combination with a polyvinyl alcohol resin that is the component B and abrasive grains of the component C, which will be described below.

That is, in the case where the organic acid is mixed in a polishing composition containing abrasive grains such as colloidal silica whose surfaces are not chemically modified or hydroxyethyl cellulose, the organic acid may fail to function as a chelating agent, resulting in a failure to sufficiently suppress the adhesion of metals, in some cases. This is presumably because the organic acid reacts with a functional group on the surfaces of colloidal silica or with HEC, thereby reducing the ratio of the organic acid that can function as a chelating agent.

For example, Si—O— and the like are generally present on the surfaces of colloidal silica. A silanol group is generated by a reaction between the Si—O— therein and $H^+$ generated from the organic acid, and a carboxyl group and a phosphono group in the organic acid generate a coordination bond with the silanol group, thereby reducing the organic acid that can function as a chelating agent in the polishing composition.

The polishing composition of this embodiment allows the organic acid to exist together with the polyvinyl alcohol resin and the abrasive grains, thereby suppressing the reaction of the organic acid on the surfaces of the abrasive grains. Thus, a large amount of the organic acid that can function as a chelating agent can be allowed to exist in the polishing composition.

(C) Abrasive Grains

The polishing composition of this embodiment contains abrasive grains whose surfaces are chemically modified so as to have a minus zeta potential on the surfaces in a solution with a pH of 2.0 or more and to have no isoelectric point.

Examples of the abrasive grains include known abrasive grain such as particles of silicon dioxide, alumina, ceria, and zirconia.

Among these, the abrasive grains composed of silicon dioxide are preferable, where colloidal silica, fumed silica, or the like is particularly preferable.

The dispersibility of the abrasive grains in a solution having a specific pH can be enhanced, for example, by giving a cationic or anionic functional group to the surfaces thereof and thereby increasing the absolute value of zeta potential in the solution.

The polishing composition of this embodiment contains the organic acid, and therefore abrasive grains that are chemically modified by an anionic functional group having a minus zeta potential in an acidic solution are preferable.

Examples of the anionic functional group in an acidic solution include a sulfonic acid group.

Further, the abrasive grains of this embodiment preferably do not have a point at which the zeta potential is 0, that is, an isoelectric point.

Further, the zeta potential is −15 mV or less, preferably −70 mV to −20 mV, in an acidic solution with a pH of 2.0 or more and 11 or less.

It is particularly preferable that the abrasive grains of this embodiment do not have a point at which the zeta potential is 0 in a solution with any pH and have a small variation in zeta potential due to pH, thus always having a minus zeta potential in an acidic solution with a pH of 2.0 or more and 11 or less.

The zeta potential and isoelectric point of the abrasive grains in this embodiment, for example, are values determined by the zeta potential that is measured by electrophoresis using a device called ELS-Z2.

The abrasive grains used in this embodiment preferably have a primary particle size of 5 nm to 40 nm, a secondary particle size of 15 nm to 120 nm, and an association degree of 3 or less, for example.

The primary particle size is a particle size measured by the BET method, the secondary particle size is a particle size measured by the dynamic light scattering method, and the association degree is a numerical value obtained by dividing the secondary particle size by the primary particle size.

In the polishing composition of this embodiment, the content of the abrasive grains, for example, is 0.001 mass % to 10 mass %, preferably about 0.01 mass % to 1 mass %.

When the content of the abrasive grains is in the aforementioned range, aggregation of an excess amount of the abrasive grains can be suppressed, while the polishing speed is maintained.

In the polishing composition of this embodiment, another component such as an alkali component and alcohol other than the components A to C may be contained. In the case where the alkali component or alcohol is mixed therein, the solubility of the organic acid in water can be improved.

In the case where the other component is contained in the polishing composition of this embodiment, the content thereof, for example, is 1 mass % or less, preferably 0.0001 mass % to 0.5 mass %.

When the content is in the aforementioned range, effects of the other component such as enhancing the solubility of the organic acid can be effectively exerted without impairing the effects of the polishing composition of this embodiment.

The polishing composition of this embodiment is a dispersion element in which the components A to C and the other component, as needed, are dispersed in a liquid such as water.

Water is preferable as the liquid. Water containing a minimum of impurities, such as distilled water and deionized water, is preferably used, in order to suppress the inhibition of various actions of the component A to C.

The polishing composition of this embodiment may be obtained by mixing the components A to C and the other component, as needed, in water at a time, or may be obtained by mixing only a part of the components in water beforehand and mixing the remaining components therein immediately before use.

Alternatively, the components may be mixed in water beforehand so as to be a concentrated solution in which each component is contained at a higher concentration than in use, and the concentrated solution is diluted to a predetermined concentration in use. In the case where the polishing composition is obtained as a concentrated solution, the concentrated solution is preferably adjusted so as to be diluted to about 100 times in use in accordance with the intended use, for example.

The range of the content of each component is shown as the content range in use as the polishing composition. In the case of the concentrated solution, the content of each component after the dilution is preferably adjusted so as to fall within the aforementioned range.

The polishing composition of this embodiment is suitable for polishing in which contamination on a surface of a wafer after the polishing is required to be exceptionally low such as polishing of a wafer, particularly, in the final step.

That is, owing to good wettability to the wafer, washing after the polishing is easy, and residual abrasive grains or polishing debris can be efficiently removed.

Further, the abrasive grains are less likely to aggregate, and therefore clogging is difficult to occur in filtering. Thus, damage or contamination of the wafer due to the aggregation of abrasive grains can be suppressed in the polishing.

Moreover, even in the case where metals derived from the polishing composition, the wafer or the like are present in the polishing composition, adhesion of the metals onto the surface of the wafer is suppressed.

According to the present invention, a polishing composition containing: a polyvinyl alcohol resin that has a 1,2-diol structure in its side chain and that is a copolymer of a monomer represented by Formula (1) above and a vinyl ester monomer; an organic acid; and abrasive grains whose surfaces are chemically modified so as to have a minus zeta potential on the surfaces in a solution with a pH of 2.0 or more and to have no isoelectric point can suppress aggregation of the abrasive grains therein, and can suppress adhesion of a slight amount of metals derived from the polishing composition or a product to be polished onto the product to be polished.

Accordingly, damage or contamination of the product to be polished due to aggregation of the abrasive grains and metal impurities can be reduced.

In the case where the organic acid is at least one chelating agent selected from the group consisting of an aminocarboxylic acid chelating agent and a phosphonic acid chelating agent, the adhesion of the metals to the product to be polished can be further suppressed.

According to the present invention as described above, while the aggregation of the abrasive grains is suppressed, contamination on the surface of the product to be polished after the polishing can be reduced.

The polishing composition according to this embodiment is as described above. However, the embodiments disclosed herein should be construed in all respects as illustrative but not limiting. The scope of the present invention is not indicated by the foregoing description but by the scope of the claims. The scope of the present invention is intended to include all the modifications equivalent in the sense and the scope to the scope of the claims.

EXAMPLES

Hereinafter, examples of the present invention are described. However, the present invention is not limited to these examples.

As materials of polishing compositions according to these examples, the following materials were prepared.
<Water Soluble Polymer>
HEC: Hydroxycellulose
Polyvinyl alcohol resin: Copolymer (with an average polymerization degree of 2000 and a weight-average molecular weight of about 80000) of the monomer represented by Formula (1) above (where $R^1$ to $R^8$ were all hydrogen atoms, and X was a single bond) and vinyl alcohol
<Acid/Alkali Component>
Organic acid: DTPA
Hydrochloric acid
Ammonia
<Abrasive Grains>
Abrasive grains 1: Colloidal silica (product name: PL-3, manufactured by FUSO CHEMICAL CO., LTD.)
Abrasive grains 2: Surface-modified colloidal silica (product name: PL-3D, manufactured by FUSO CHEMICAL CO., LTD.)
<Water>
Deionized water
<Measurement of Metal Contamination Concentration>

Polishing compositions (concentrated undiluted solutions) mixed as described in Table 1 below were produced. The numerical values in the table are expressed as wt %, and the values of hydrochloric acid, ammonia, DTPA respectively are corresponding values when using 100% hydrochloric acid, 100% ammonia, and 100% DTPA. The values of HEC and polyvinyl alcohol resin are values in terms of solid components.

Polishing compositions obtained by diluting the polishing compositions (concentrated undiluted solution) to 30 times with deionized water were used for evaluation.

TABLE 1

| mass % | No. 1 | No. 2 | No. 3 |
|---|---|---|---|
| Deionized water | 88.93 | 89.05 | 89.21 |
| Abrasive grains 1 | | | |
| Abrasive grains 2 | 10.50 | 10.50 | 10.50 |
| Polyvinyl alcohol resin | 0.25 | 0.25 | 0.25 |
| Ammonia | 0.02 | 0.20 | |
| Hydrochloric acid | | | 0.04 |
| DTPA | 0.30 | | |

As pseudo-metal contamination sources, Fe: iron nitrate (III) nonahydrate, Cr: chromium nitrate (III) nonahydrate, Ni: nickel nitrate (II) hexahydrate, and Cu: copper nitrate (II) trihydrate were added to each of the polishing compositions Nos. 1 to 3 so that the Fe, Cr, Ni, Cu each have a concentration of 1 ppm. Thus, the polishing compositions Nos. 1 to 3 subjected to pseudo-metal contamination were used as Example 1 and Comparative Examples 2 and 3. Further, the polishing composition No. 2 to which the metal sources were not added was used as Comparative Example 1.

A wafer was polished using Example 1 and Comparative Examples 1 to 3 under the following conditions. Table 2 shows the results of measurement of the metal concentration and LPD (Light Point Defects) in the wafer after the polishing by the following method.

Table 2 also shows the results of measurement of the pH of each polishing composition before the polishing using a pH meter (manufactured by HORIBA, Ltd.).

Three wafers were used for measuring the metal concentration and LPD.
<Polishing Conditions>
Polishing device: 20-inch single side polisher (manufactured by Strasbaugh Inc.)
Polishing pad: Supreme RN-H (manufactured by Nitta Haas Incorporated) Platen speed: 100/115 rpm
Polishing load bearing surface pressure: 100 gf/cm$^2$
Flow rate of polishing composition: 300 ml/min
Product to be polished: Silicon wafer (diameter: 200 mm)
Polishing time: 300 s
<Measurement Method of Metal Concentration>

For measuring the metal concentration, a wafer after the polishing under the aforementioned polishing conditions was subjected to SC-1 washing with an ammonia-hydrogen peroxide aqueous solution at 75° C. for 5 minutes, followed by exposure of the wafer to HF vapor, and thereafter an etching liquid on the surface of the wafer was collected using SC3000, manufactured by NAS GIKEN Ltd., Corp. The collected liquid was subjected to ICP-MS analysis using 7500CS, manufactured by Agilent Technologies, Inc., so that the metal contamination concentration with respect to the silicon wafer was calculated.
<Measurement Method of LPD>

For measuring the LPD, a wafer after the polishing under the aforementioned polishing conditions was subjected to SC-1 washing with an ammonia-hydrogen peroxide aqueous solution at 75° C. for 5 minutes, and thereafter defects of 60 nm or more were counted using LS6600, manufactured by Hitachi engineering Co., Ltd.

TABLE 2

| Polishing composition | | pH | LPD | Metal contamination concentration $10^9$ atms/cm$^2$ | | | |
|---|---|---|---|---|---|---|---|
| | | | | Cr | Fe | Ni | Cu |
| Ex. 1 | No. 1 | 3 | 186 | 0.30 | 4.40 | 0.40 | 23.90 |
| | | | 187 | 0.40 | 8.90 | 0.40 | 19.80 |
| | | | 187 | 0.30 | 7.70 | 0.40 | 24.10 |
| C. Ex. 1 | No. 2 (No metal sources added) | 10.3 | 163 | 1.10 | 15.70 | 1.10 | 4.10 |
| | | | 152 | 5.30 | 13.80 | 0.70 | 3.10 |
| | | | 143 | 3.00 | 7.70 | 0.70 | 3.10 |
| C. Ex. 2 | No. 2 | 10.3 | 184 | 0.50 | 15.10 | 13.70 | 115.20 |
| | | | 160 | 0.30 | 8.00 | 12.90 | 98.60 |
| | | | 165 | 10.10 | 22.70 | 12.80 | 98.40 |
| C. Ex. 3 | No. 3 | 3 | Over | 0.70 | 18.90 | 35.10 | 26551.30 |
| | | | Over | 0.80 | 21.70 | 37.80 | 22772.50 |
| | | | Over | 1.80 | 30.20 | 41.30 | 24406.30 |

As is obvious from Table 2, only slight amounts of all the four metals were detected from the wafer after the polishing in Example 1.

The wafer after the polishing in Example 1 showed a metal contamination concentration as low as or lower than a wafer after the polishing in Comparative Example 1, which is a polishing composition to which no pseudo contamination sources were added.

On the other hand, in Comparative Example 2 to which ammonia was mixed instead of DTPA, the contamination by nickel and copper could not be reduced as much as in Example 1, though the metal contamination and LPD could be suppressed to some extent.

In Comparative Example 3 to which hydrochloric acid was mixed instead of DTPA, the value of LPD was high to an unmeasurable extent. In particular, the contamination concentration by copper was exceptionally high.

The expression that the value of LPD was unmeasurable means that the counted number of LPD is equal to or more than 30000, and the device stops the measurement.

<Composition Analysis>

Polishing compositions (concentrated undiluted solutions) mixed as shown in Table 3 were produced, and thereafter were allowed to stand still at 23° C. for 12 hours or more. Then, polishing compositions obtained by diluting them with deionized water to 30 times were subjected to the following analysis.

It should be noted that the composition No. 13 was Example 2.

TABLE 3

| mass % | No. 4 | No. 5 | No. 6 | No. 7 |
|---|---|---|---|---|
| Deionized water | Remaining | Remaining | Remaining | Remaining |
| Abrasive grains 1 | | 10.5 | | 10.5 |
| Abrasive grains 2 | 10.5 | | 10.5 | |
| Polyvinyl alcohol resin | 0.25 | | | 0.25 |
| HEC | | | | |
| Ammonia | | | | |
| Hydrochloric acid | | | | |
| DTPA | | | | |

| mass % | No. 8 | No. 9 | No. 10 | No. 11 |
|---|---|---|---|---|
| Deionized water | Remaining | Remaining | Remaining | Remaining |
| Abrasive grains 1 | | 10.5 | | 10.5 |
| Abrasive grains 2 | 10.5 | | 10.5 | |
| Polyvinyl alcohol resin | 0.25 | | | |
| HEC | | 0.25 | 0.25 | |
| Ammonia | | | | 0.02 |
| Hydrochloric acid | | | | |
| DTPA | | | | 0.3 |

TABLE 3-continued

| mass % | No. 12 | No. 13 | No. 14 | No. 15 |
|---|---|---|---|---|
| Deionized water | Remaining | Remaining | Remaining | Remaining |
| Abrasive grains 1 | | | 10.5 | |
| Abrasive grains 2 | 10.5 | 10.5 | | 10.5 |
| Polyvinyl alcohol resin | | 0.25 | | |
| HEC | | | 0.25 | 0.25 |
| Ammonia | 0.02 | 0.02 | | |
| Hydrochloric acid | | | | |
| DTPA | 0.3 | 0.3 | 0.3 | 0.3 |

The pH of each composition was measured using a pH meter (manufactured by HORIBA, Ltd.).

Further, the particle size and the specific surface area of each composition were measured using a NMR-type wetted specific surface area measuring device (acorn area, manufactured by XiGo Nanotools).

Further, the zeta potential of abrasive grains in each composition was measured using a zeta-potential analyzer (device name: ELS-Z2, manufactured by Otsuka Electronics Co., Ltd.). Table 4 shows the results.

TABLE 4

| | pH | Particle size nm | Specific surface area m$^2$/g | Zeta potential mV |
|---|---|---|---|---|
| No. 4 | 3.70 | 68 | 167 | 3 |
| No. 5 | 7.30 | 66 | 83 | −31 |
| No. 6 | 6.50 | 69 | 247 | −48 |
| No. 7 | 7.50 | 78 | 78 | −29 |
| No. 8 | 6.70 | 78 | 234 | −34 |
| No. 9 | 6.10 | 3231 | 196 | −1 |
| No. 10 | 6.20 | 355 | 257 | −17 |
| No. 11 | 3.70 | 66 | 151 | 0.3 |
| No. 12 | 3.50 | 69 | 203 | −33 |
| No. 13 (Ex. 2) | 3.63 | 70 | 222 | −36 |
| No. 14 | 3.30 | 5483 | 257 | 1 |
| No. 15 | 3.32 | 1253 | 240 | 2 |

The following conclusions are drawn from the results shown in Table 4.

No. 5 is an aqueous dispersion of general colloidal silica (abrasive grains 1) whose surfaces are not modified, and No. 6 is an aqueous dispersion of colloidal silica (abrasive grains 2) whose surfaces are modified. When these two are compared, the surface-modified colloidal silica has a greater absolute value of the zeta potential as compared to the general colloidal silica.

No. 7 and No. 8 are compositions combining the polyvinyl alcohol resin respectively with the abrasive grains 1 and the abrasive grains 2. It can be seen that particles in the composition combining it with the abrasive grains 1 have a smaller specific surface area, that is, poorer water dispersibility than particles in the composition combining it with the abrasive grains 2. Accordingly, the aggregation is more likely to occur therein.

It can be seen that No. 9 and No. 10 in which HEC is mixed both have a large particle size, that is, aggregation of the abrasive grains occurs therein.

On the other hand, it is clear that, in the composition No. 11 in which DTPA is mixed as the organic acid and the pH is adjusted to 3.7, the zeta potential is 0.3, which approximates 0, that is, the abrasive grains 1 have a zeta potential close to 0 (have an isoelectric point) in this pH range. On the other hand, in No. 12 with a pH of 3.5, the zeta potential is as low as −33, and therefore it is obvious also from this result that the isoelectric point of the abrasive grains 2 is not around pH 3.5.

That is, it is inferred that No. 11 undergoes not much aggregation in a measurement at which not much time has elapsed after the production, but aggregation proceeds when a long time has elapsed.

When No. 8 and No. 13 (Example 2) are compared to each other, the particle size and the zeta potential do not significantly differ depending on the presence or absence of DTPA as the organic acid. That is, it is considered that the abrasive grains and the polyvinyl alcohol resin do not react with DTPA.

On the other hand, when No. 5 and No. 11 are compared to each other, the zeta potential significantly changes depending on the presence or absence of DTPA. That is, it is considered that DTPA has reacted with (has been adsorbed by) the abrasive grains.

Further, No. 9 combining general colloidal silica (abrasive grains 1) with HEC and No. 14 adding DTPA to No. 9 are compared to each other, it can be seen that, in No. 14 in which DTPA is mixed, the particle size of the abrasive grains is significantly large, that is, the aggregation has proceeded. On the other hand, the aggregation has proceeded due to DTPA being mixed, also in the case where the abrasive grains of No. 14 are altered by the surface-modified abrasive grains 2 (No. 15), as compared to No. 10 in which DTPA is not mixed. That is, it can be seen that, in the case where the organic acid exists together with a system in which HEC is mixed, the aggregation of abrasive grains proceeds.

<Analysis of Abrasive Grains>

Variation in zeta potential due to variation in pH of the abrasive grains 1 and the abrasive grains 2 was measured.

The abrasive grains were subjected to pH adjustment by adding a HCl aqueous solution and a NaOH aqueous solution to 20 wt % of a silica aqueous solution having a pH of 7, and thereafter were measured using the zeta-potential analyzer (device name: ELS-Z2, manufactured by Otsuka Electronics Co., Ltd.) at each pH shown in FIG. 1.

As shown in FIG. 1, the abrasive grains 2 had exceptionally small variation in zeta potential due to pH variation, and showed a minus zeta potential in a pH region from 2.0 to 11. Further, no isoelectric point was observed in this range. On the other hand, the abrasive grains 1 had significant variation in zeta potential due to pH variation. Further, they had an isoelectric point around pH 4.0.

The invention claimed is:

1. A polishing composition comprising:
   a polyvinyl alcohol resin having a 1,2-diol structure in its side chain, the polyvinyl alcohol resin being a copolymer of a monomer represented by Formula (1) below and a vinyl ester monomer;
   an organic acid; and
   inorganic abrasive grains whose surfaces are chemically modified so as to have a minus zeta potential on the surfaces and to have no isoelectric point, wherein the inorganic abrasive grains are at least one of inorganic abrasive grains composed of silicon dioxide, inorganic abrasive grains composed of alumina, inorganic abrasive grains composed of ceria, and inorganic abrasive grains composed of zirconia:

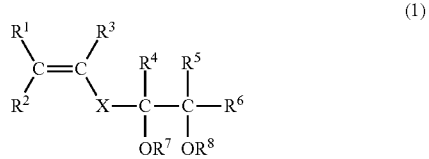

(where $R^1$ to $R^6$ each independently denote a hydrogen atom or an organic group, X denotes a single bond or a linking group, and $R^7$ and $R^8$ each independently denote a hydrogen atom or $R^9$—CO— (where $R^9$ denotes an alkyl group)).

2. The polishing composition according to claim 1, wherein
   the organic acid is at least one chelating agent selected from the group consisting of an aminocarboxylic acid chelating agent and a phosphonic acid chelating agent.

3. The polishing composition according to claim 1, wherein the content of the polyvinyl alcohol resin is 0.00001 mass % to 0.5 mass %.

4. The polishing composition according to claim 2, wherein the content of the polyvinyl alcohol resin is 0.00001 mass % to 0.5 mass %.

5. A polishing composition comprising:
   a polyvinyl alcohol resin having a 1,2-diol structure in its side chain, the polyvinyl alcohol resin being a copolymer of a monomer represented by Formula (1) below and a vinyl ester monomer;
   an organic acid; and
   abrasive grains whose surfaces are chemically modified so as to have a minus zeta potential on the surfaces and to have no isoelectric point, wherein the content of the polyvinyl alcohol resin is 0.00001 mass % to 0.5 mass %:

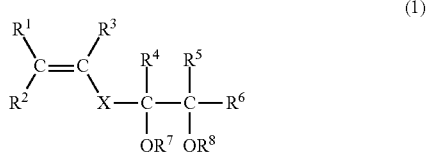

(where R' to $R^6$ each independently denote a hydrogen atom or an organic group, X denotes a single bond or a linking group, and $R^7$ and $R^8$ each independently denote a hydrogen atom or $R^9$—CO— (where $R^9$ denotes an alkyl group)).

6. The polishing composition according to claim 5, wherein
   the organic acid is at least one chelating agent selected from the group consisting of an aminocarboxylic acid chelating agent and a phosphonic acid chelating agent.

* * * * *